United States Patent [19]

Nakata et al.

[11] Patent Number: 4,795,261
[45] Date of Patent: Jan. 3, 1989

[54] REDUCTION PROJECTION TYPE ALIGNER

[75] Inventors: Toshihiko Nakata, Yokoyama; Yoshitada Oshida, Fujisawa; Masataka Shiba, Yokohama, all of Japan

[73] Assignee: Hitachi, Ltd., Tokyo, Japan

[21] Appl. No.: 944,524

[22] Filed: Dec. 22, 1986

[30] Foreign Application Priority Data

Dec. 24, 1985 [JP] Japan .................................. 60-289209
Nov. 19, 1986 [JP] Japan .................................. 61-273996

[51] Int. Cl.⁴ ............................................ G01B 11/00
[52] U.S. Cl. ..................................................... 356/401
[58] Field of Search ............... 356/399, 400, 401, 363; 250/492.1, 491.1

[56] References Cited

U.S. PATENT DOCUMENTS

| | | | |
|---|---|---|---|
| 3,905,703 | 9/1975 | Matsumoto | 356/106 R |
| 4,380,395 | 4/1983 | Kuniyoshi et al. | 356/401 |
| 4,389,824 | 8/1983 | Feldman et al. | 356/401 |
| 4,614,432 | 9/1986 | Kuniyoshi et al. | 356/401 |
| 4,652,134 | 3/1987 | Pasch et al. | 356/401 |

Primary Examiner—Bruce C. Anderson
Assistant Examiner—Paul A. Guss
Attorney, Agent, or Firm—Antonelli, Terry & Wands

[57] ABSTRACT

A reduction projection type aligner in a reduction projection exposing device for exposing a circuit pattern on a mask through a reduction projection lens onto a wafer by the step and repeat of the wafer, which comprises: a light source for irradiating coherent irradiation light, a reflection mirror for reflecting the coherent irradiation light irradiated from the light source, a detection optical system for detecting an interference pattern by optically causing interference between an alignment pattern reflection light obtained by entering the coherent irradiation light irradiated from the light source through the reduction projection lens to the alignment pattern portion of the wafer, which is then reflected at the alignment pattern portion and then passed through the reduction projection lens and a reflection light reflected at the reflection mirror, and means for aligning a mask and a wafer relatively by detecting the position of the wafer by the video image signals in the interference pattern detected by the detection optical system.

8 Claims, 11 Drawing Sheets

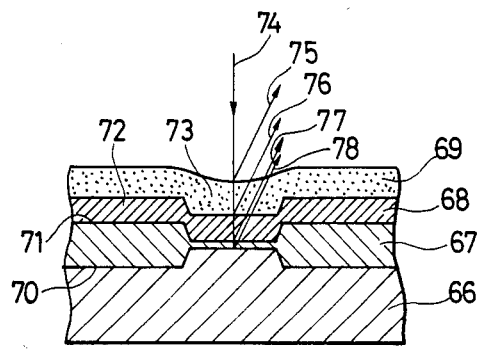
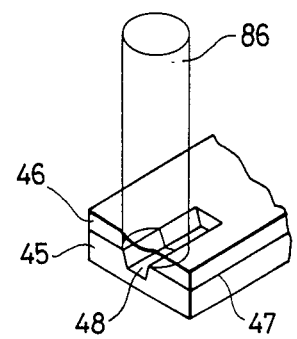
FIG. 11
FIG. 13
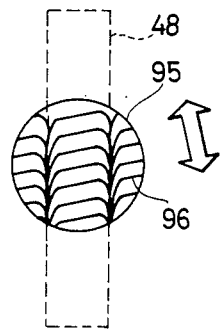
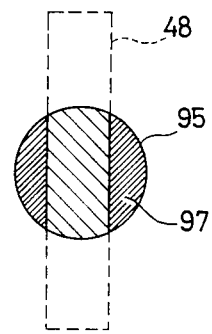
FIG. 14(a)
FIG. 14(b)
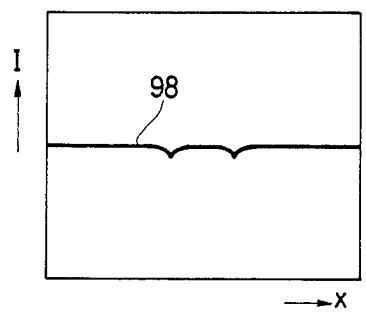
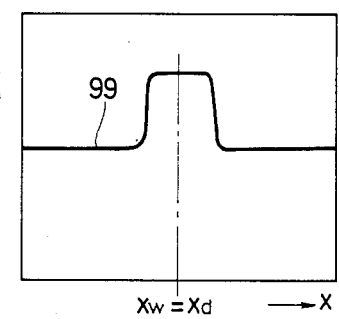
FIG. 15(a)
FIG. 15(b)

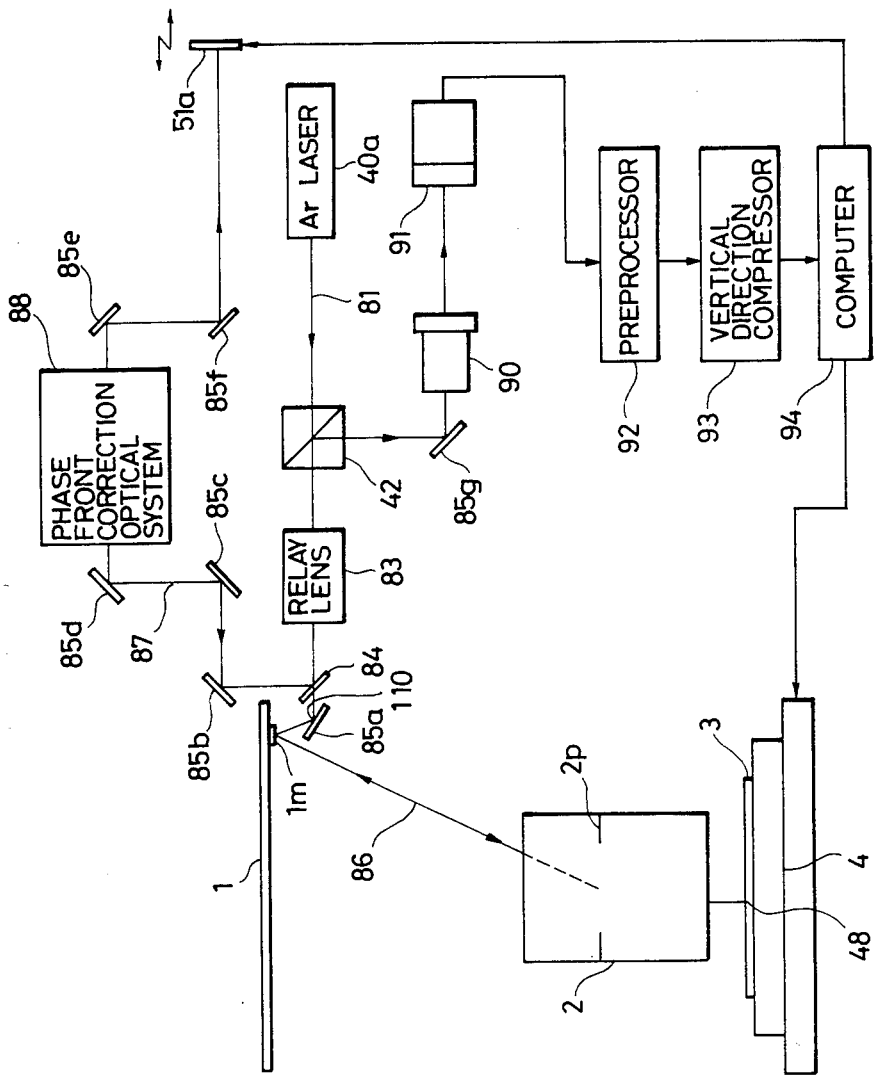

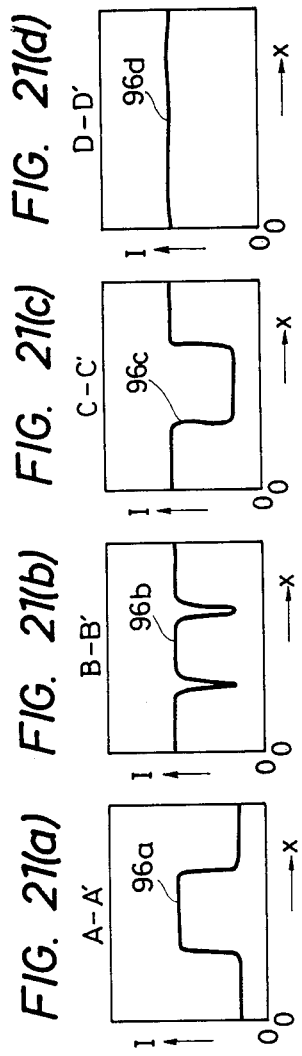

REDUCTION PROJECTION TYPE ALIGNER

BACKGROUND OF THE INVENTION

This invention relates to reduction projection type alignment system for the alignment of a circuit pattern on a mask (reticle) and a wafer at a high accuracy.

As the structures of the semiconductor integrated circuits have become finer, higher accuracy is demanded for the alignment between the reticle and the wafer upon exposure by a reduction projection type exposure at present. In view of the above, it is considered that a TTL alignment system carried out by way of a reduction projection lens capable of alignment on every chips thereby coping with arrangement errors of chips within a wafer will take a leading position in the feature manufacture of densely integrated circuits.

FIG. 1 shows one example of the TTL alignment system, in which the circuit pattern of mask (reticle) 1 is exposed to one or several units of chips 16 at wafer 3 on wafer stage 4 by way of reduction projection type lens 2. The position for initial reticle setting patterns 15 and 15' are at first detected by reticle alignment optical systems 5 and 5' prior to the exposure and the mask (reticle) 1 is thereby set to the initial position. Then, alignment patterns 14 and 14' near the chip 16 on the wafer 3 are focused by way of the reduction projection lens 2 to alignment patterns (window patterns) 13 and 13' on the mask (reticle) 1, and both of the patterns are detected by a wafer alignment detecting optical system. The wafer alignment detecting optical system comprises mirrors 6 and 6', relay lenses 7 and 7', magnifying lenses 8 and 8', movable slits 9 and 9', photomultipliers 10 and 10', optical fibers 11 and 11' for emitting alignment irradiation light at an identical wave length with the exposure light and the like. The irradiation light from the optical fibers 11 and 11' are irradiated through the half mirrors, relay lenses 7 and 7', mirrors 6 and 6' to the alignment patterns 13 and 13', whereas reflection light therefrom are detected by the photomultipliers 10 and 10' by way of the mirrors 6 and 6', relay lenses 7 and 7', half mirrors, magnifying lenses 8 and 8', mirrors and movable slits 9 and 9'. If the detected wafer alignment patterns 14 and 14' do not agree with the positions for the reticle alignment patterns 13 and 13', the wafer stage 4 carrying the wafer 3 is moved in the direction X or Y in accordance with the direction and the extent of the displacement, by which the positions for the patterns 14 and 14' are aligned with those for the patterns 13 and 13'. After the alignment has thus been completed, the exposure light is irradiated through the exposure system 12 to the mask (reticle) 1. The information concerning the alignment system of this type is disclosed, for example, in U.S. Pat. No. 4,362,389.

By the way, the TTL alignment system involves a problem of the lowering in the alignment accuracy caused by the uneven coating of photoresist on the wafer which has been pointed out so far but not yet solved. The problem has become more serious in recent years as the density of the semiconductor circuits has been increased.

SUMMARY OF THE INVENTION

In view of the foregoing problems in the prior art, it is an object of this invention to provide a reduction projection type alignment system which is stable being free from the coating thickness and uneven coating of photoresist, provides favorable accuracy and capable of aligning a mask (reticle) and a wafer at high accuracy.

The foregoing object can be attained in accordance with this invention by irradiating an alignment pattern on a wafer and a reflection mirror disposed at a position other than the wafer with coherent light for alignment irradiation, causing optical interference the reflection light from the alignment pattern obtained through a reduction projection lens and the reflection light from the reflection mirror, detecting an interference pattern obtained by the interference and the alignment pattern on the mask (reticle) irradiated by the alignment irradiation light by an alignment optical system, thereby determining the amount of alignment based on the center positions for both of the patterns and aligning the reticle and the wafer relative to each other.

More specifically, the interference pattern is obtained by causing the reflection light from the surface of the photoresist and the reflection light from the interface between the stepped pattern on the Si substrate and the photoresist to interfer with the reflection light from the mirror. Interferring effect of the reflection light from the interface between the stepped pattern and the photoresist with the reflection light from the reflection mirror is most significant in the interference pattern, and the interference pattern can be obtained as having great signal changes due to the change of the phase by the step depth in the stepped portion of the alignment pattern. That is, the interferring effect due to the layer thickness of the photoresist is decreased. Accordingly, it is possible to make a relative alignment between the mask and the wafer by detecting the interference pattern and the alignment pattern on the mask (reticle) by the alignment optical system and determining the amount of the alignment based on the center positions for both of the patterns.

BRIEF DESCRIPTION OF THE DRAWINGS

FIGS. 10 (b), (c) are views for illustrating the difference in the intensity distribution of reflection light between the conventional system and the alignment system according to this invention;

FIG. 11 is a view showing the cross section of the alignment pattern having other transparent layers applicable with this invention;

FIG. 12 is a view showing the alignment optical system in one embodiment of the system according to this invention;

FIG. 13 is a view showing the incident state of irradiation light in this case to the alignment pattern;

FIGS. 14(a), (b) are, respectively, views showing examples of picked-up interference patterns;

FIGS. 15 (a), (b) are, respectively, views showing 1-dimensional signal waveform obtained by the compression processing of interference pattern;

FIGS. 21 (a), (b), (c), (d) are views showing detection signals in a longitudinal direction of the interference fringe pattern;

FIGS. 22 (a), (b), (c), (d) are views showing signals after the differentiation processing for the detection signals shown in FIGS. 21 (a), (b), (c), (d);

FIGS. 23 (a), (b), (c), (d) are views showing the signals after the absolute value processing for the signals shown in FIGS. 22 (a), (b), (c), (d).

BRIEF DESCRIPTION OF THE PREFERRED EMBODIMENTS

This invention will now be described referring to FIGS. 7 through 18.

Before specific explanation for the invention, the logical background therefor will be described.

Figure 1:
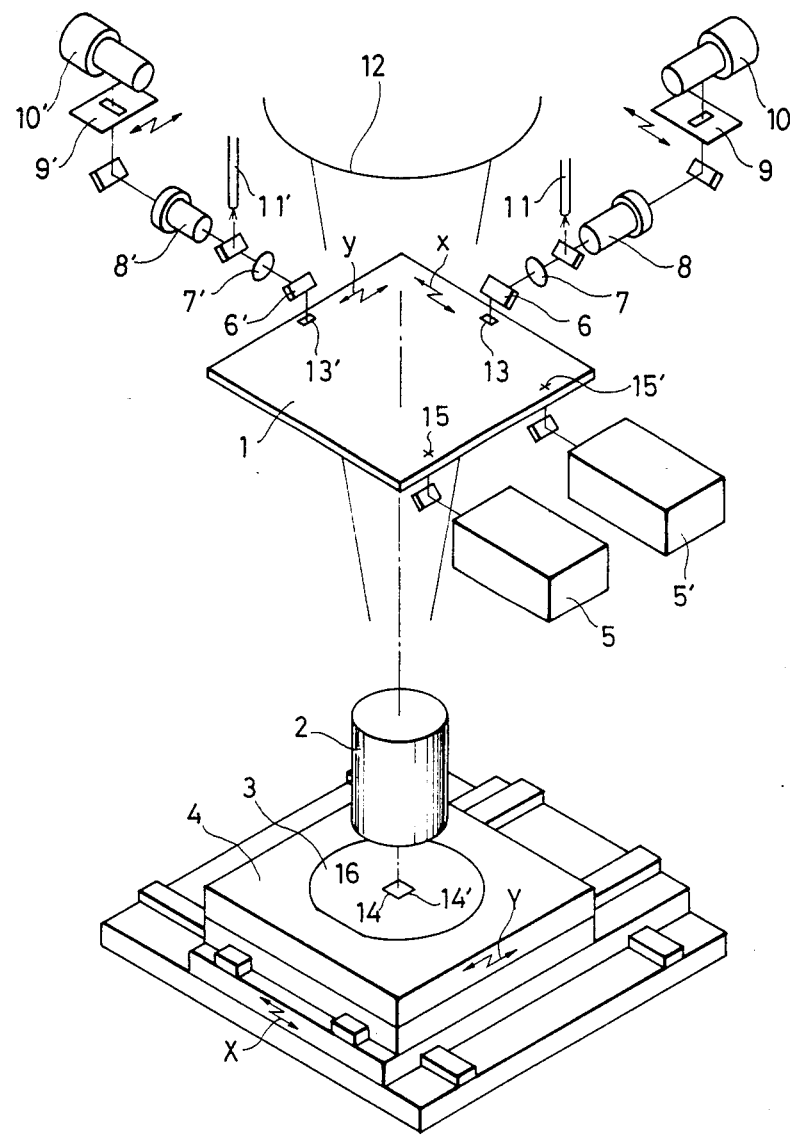
FIG. 1 is a view showing one example of a conventional TTL alignment system.
Figure 2:
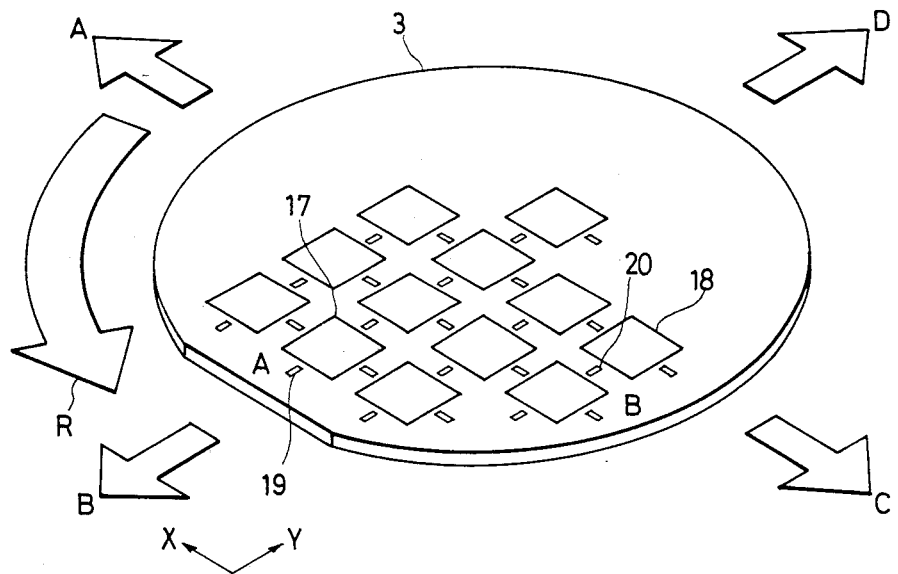
FIG. 2 is a view illustrating the method of coating photoresist to a wafer.
Figure 3:
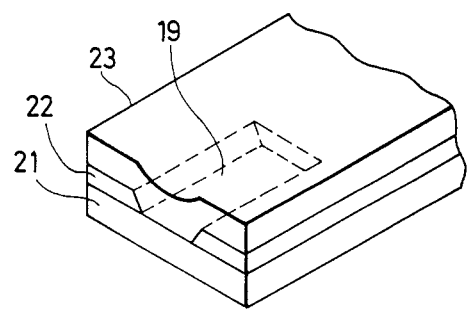
FIG. 3 is an enlarged view of a wafer alignment pattern.
Figure 4A:
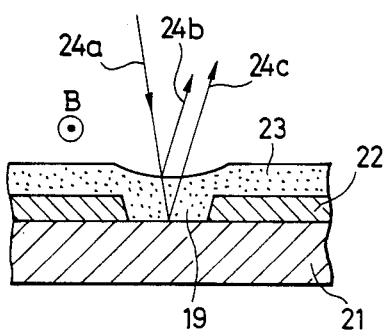
FIGS. 4 (a) and (b) are views showing the difference in the distribution of the photoresist layer thickness depending on the alignment pattern.
Figure 4B:
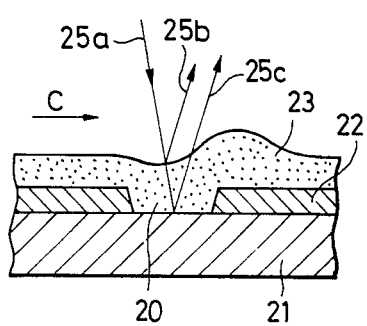

Referring at first to the method of coating photoresist to a wafer, photoresist is coated to the entire surface of wafer 3 to a thickness of from 1 to 2 $\mu$m (in the case of a mono-layer resist) by the centrifugal force upon high speed rotation of the wafer 3 in the direction R by a spin coater (rotational coating machine) as shown in FIG. 2. In this case, the photoresist flows is in the directions extending radially from the center for the wafer 3 as shown by arrows A, B, C and D. FIG. 3 shows alignment pattern 19 in the direction X near chip 17. As shown in FIG. 3, the alignment pattern is usually constituted by forming a recessed or protruded stepped pattern with SiO$_2$ layer 22 on Si substrate 21, and the layer thickness of the photoresist 23 coated further thereover forms a moderate curve depending on the shape of the step. The alignment pattern is thus formed on the Si substrate 21. There is, however, a problem that although the alignment pattern 19 in the direction X near the chip 17 is in parallel with the flowing direction B of the resist, the alignment pattern 20 in the direction X near the chip 18, for example, is substantially perpendicular to the flowing direction C of the resist as shown in FIG. 2. As a result, as shown in FIG. 4, the distribution for the layer thickness of photoresist is in right-to-left symmetry in the lateral direction of the pattern at the portion of the alignment pattern 19, whereas the distribution for the layer thickness of photoresist at the portion of the alignment pattern 20 is not in right-to-left symmetry with the photoresist flow being disturbed remarkably in the pattern edge portion as shown in FIG. 4 (b).

Figure 5A:
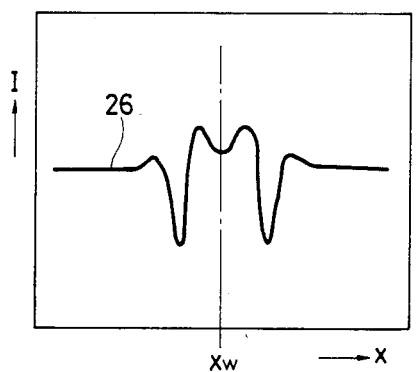
FIGS. 5 (a) and (b) are views showing the difference in the intensity distribution of the reflection light from the alignment pattern depending on the difference in the distribution of layer thickness.
Figure 5B:
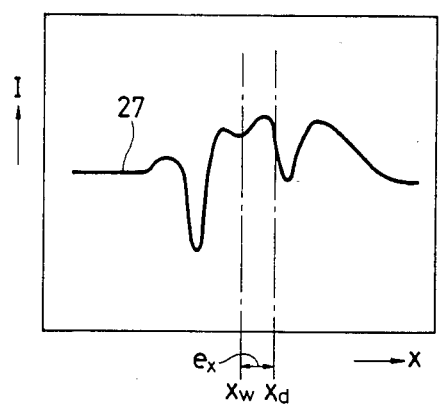

Now, while these alignment patterns 19 and 20 are irradiated by pattern irradiation light 24a, 25a, reflection light from the patterns is approximately be obtained as the interference light between the reflection light 24b, 25b from the surface of the photoresist and the reflection light 24c, 25c from the surface of the Si substrate 21 or the SiO$_2$ layer 22. That is, the interference light intensity I varies periodically depending on the layer thickness d of the photoresist 23 as can be seen from interference intensity curve 28 shown in FIG. 6. As described above, intensity distribution 26 for the reflection light from the alignment pattern 19 is in right-to-left symmetry as shown in FIG. 5 (a), whereas intensity distribution 27 for the reflection light from the alignment pattern 20 is not in right-to-left symmetry as shown in FIG. 5 (b). Accordingly, in the conventional alignment system for determining the center of the symmetry of the waveform as the center position for the alignment pattern by utilizing the symmetricity of the detected signal waveform as described above, Xd is regarded as the center position for the pattern instead of the true center position Xw for the pattern as shown in FIG. 5 (b) to possibly result in error ex, by which the alignment accuracy is inevitably reduced. Further, it has already been pointed out for the conventional TTL (through the projection lens) alignment system that the contrast of the pattern detection signal varies greatly not only with the uneven coating but also due to the layer thickness of the photoresist.

Figure 7:
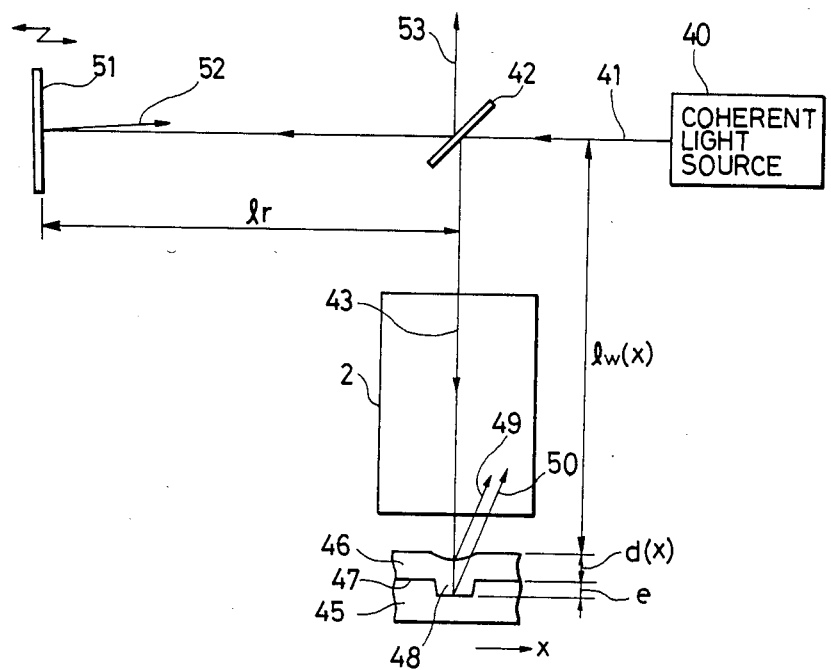
FIG. 7 is a view showing the optical system for illustrating the principle of this invention.
Figure 8:
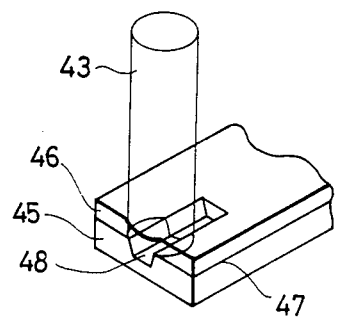
FIG. 8 is a view showing the incident state of the irradiation light to the alignment pattern.
Figure 9:
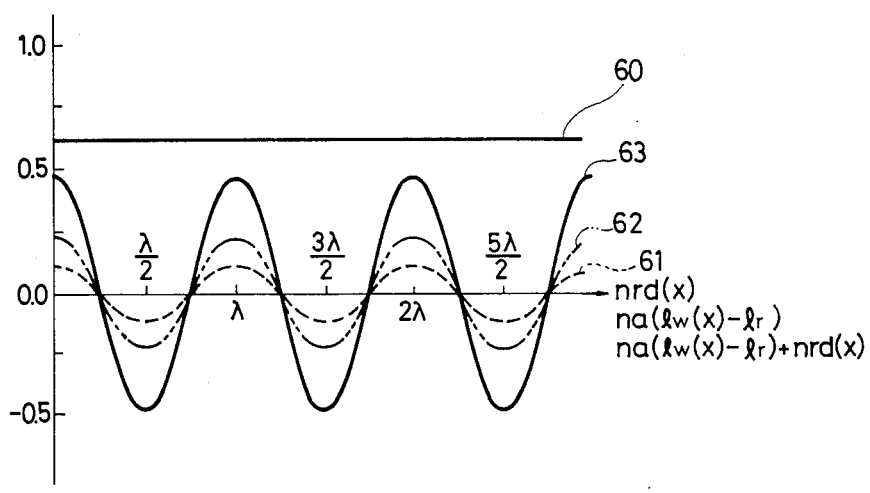
FIG. 9 is a view showing the relationship between the difference in the optical path length and the interference intensity.

This invention has been achieved taking notice of the fact that the reflectivity at the interface between the photoresist and the step pattern constituting the wafer alignment pattern is greater as compared with the reflectivity at the interface between the photoresist coated on the wafer and air. Assuming an Si step pattern as the alignment pattern, while the reflectivity at the interface between the photoresist and the air is usually about 5.5% (refractive index of air: 1.0, refractive index of photoresist: 1.61, (wavelength at 514 nm)), whereas the reflectivity at the interface between the photoresist and the alignment pattern (step pattern) is as high as 24% (Si refractive index: 4.75 (wavelength 514 nm)). Then, the optical system as shown in FIG. 7 has been taken into consideration. As shown in FIG. 7, irradiation light 41 from a coherent light source 40 such as a laser source is split by a beam splitter 42 into two directions, in which one of them is irradiated as alignment irradiation light 43 on alignment pattern 48 on a wafer by way of a reduction projection lens 2. The alignment pattern 48 is formed as a step pattern of Si substrate 45 and photoresist 46 is coated thereover. While on the other hand, the other beam is entered to a reflection mirror 51 (half mirror)(transmittance: 0 in this case). In this case, the optical path length lr from the beam splitter 42 to the reflection mirror (half mirror) 51 is substantially made equal to the optical path length lw(X) from the beam splitter 42 to the surface of the photoresist 46 and the difference between the optical path lengths is set within a interfering distance of the coherent light source 40, by which reflection light 49 from the surface of the photoresist 46 and reflection light 50 from interface 47 between the step pattern and the photoresist 46 of the Si substrate 45 interfer with the reflection light 52 from the reflection mirror 51 to result in interference pattern 53, the details for which will be described later. In the interference pattern 53, the most intense effect is resulted mainly due to the interference between the reflection light 50 from the interface 47 between the step pattern and the photoresist 46 and the reflection light 52 from the reflection mirror 51, and the interference pattern 53 can be obtained as having great signal changes due to the change of the phase by step depth e at the step portion of the alignment pattern 48. That is, the effect of the interference caused from the layer thickness d(X) of the photoresist 46 is relatively decreased. Thus, it is possible to align the reticle and the wafer relatively at a high accuracy by detecting the interference pattern 53 and the alignment pattern on the reticle (not illustrated) by an alignment optical system (not illustrated) equipped with a magnify lens and an image pick-up device and determining the alignment amount based on the center positions for both of the patterns. FIG. 8 shows the incident state of the irradiation light 43 comprising parallel beams entered into the alignment pattern 48.

By the way, the reflection mirror to which the irradiation light is entered generally means those mirrors including half mirror and it also contains the case of the mirror with transmittance at zero as in the optical system shown in FIG. 7. It is possible to dispose the reflection mirror out of the optical path of the alignment pattern irradiation light on the wafer including the reduction projection lens or dispose the mirror within the optical path of the irradiation light as described later. Desirably, a phase front correcting optical system is disposed in the optical path provided with the reflection mirror. Further, the light from a coherent light source has a interfering characteristic in view of the time and space. The interference pattern already described has now been explained more specifically. In the optical system shown in FIG. 7, the intensity distribution I(x) of the interference pattern 53 due to three reflection lights, that is, reflection light from the surface of the photoresist 46, reflection light 50 from the interface 47 between the step pattern of the Si substrate 45 and the photoresist 46 and reflection light 52 from the half mirror 51 are approximately represented by the following formula (1):

$$I(x) = (I_1 + I_2 + I_r) + \\ 2\sqrt{I_1 \cdot I_2} \cos\left(\frac{4\pi n_r d(x)}{\lambda}\right) + \\ 2\sqrt{I_1 \cdot I_r} \cos\left(\frac{4\pi n_a(l_w(x) - l_r)}{\lambda}\right) + \\ 2\sqrt{I_2 \cdot I_r} \cos\left(\frac{4\pi \{n_a(l_w(x) - l_r) + n_r d(x)\}}{\lambda}\right) \quad (1)$$

where,
$I_1$: intensity of reflection light 49
$I_2$: intensity of reflection light 50
$I_r$: intensity of reflection light 52
$\lambda$: wavelength of alignment irradiation light
$n_a$: refractive index of air
$n_r$: refractive index of photoresist In the equation (1), the first term represents a DC component in the interference intensity, the second term represents a modifying component in the interference intensity between the reflection light 49 and the reflection light 50, the third term represents a modifying component in the interference intensity between the reflection light 49 and the reflection light 52 and the fourth term represents modifying ingredient in the interference intensity between the reflection light 50 and the reflection light 52 respectively.

Assuming the intensity of the irradiation light 41 as 1, the ratio between the reflectivity and the transmittance at the beam splitter 42 as 1: $n_a = 1$, $n_r = 1.6$ ($\lambda = 436$ nm), the reflectivity at the half mirror 51 as 95%, the reflectivity at the photoresist 46 −air interface as 5.5% and the reflectivity at the interface 47 between the step pattern and the photoresist 46 as 24%, the first term in the equation (1) is represented as straight line 60 in FIG. 9, the second term is represented by curve 61, the third term is represented by curve 62 and the fourth term is represented by curve 63 respectively. From FIG. 9, it can be seen that the effect of the fourth term in the equation (1), that is, the effect due to the interference between the reflection light 50 from the surface 47 between the step pattern and the photoresist 46 and the reflection light 52 from the reflection mirror 51 appears most intensely in the intensity distribution of the interference pattern 53. As a result, the interference pattern 53 can be obtained as having great signal changes due to the change of the phase by the step depth e at the step portion of the alignment pattern 48. This is caused by the higher reflectivity at the interface 42 than that at the surface of the photoresist 46. Thus, the effects of the interference due to the layer thickness d(X) in the photoresist 46 is relatively decreased.

Figure 6:
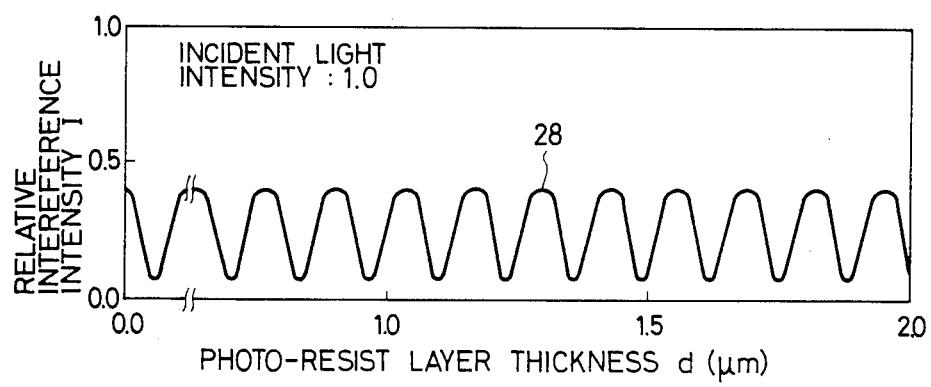
FIG. 6 is a view showing the relationship between the layer thickness of the photoresist and the interference intensity.
Figure 10A:
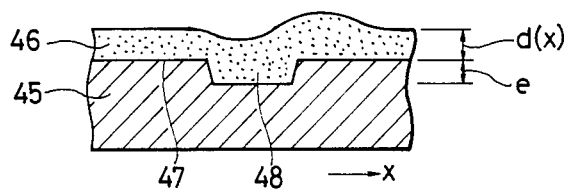
FIG. 10 (a) is a view showing the cross section of the alignment pattern portion for illustrating the uneven coated state of the photoresist.
Figure 10B:
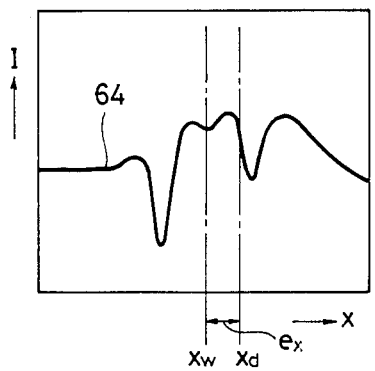
Figure 10C:
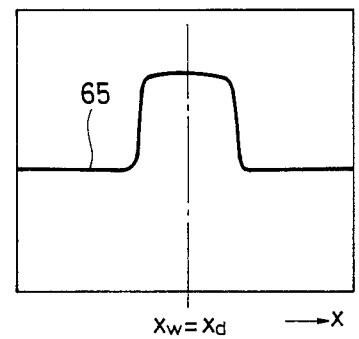

Accordingly, as shown in FIG. 10 (a), in the case where the distribution of the layer thickness in the photoresist 46 is in not in right-to-left symmetry at the step portion of the alignment pattern 48, the intensity distribution 64 of the reflection light from the alignment pattern 48 is not in a right-to-left symmetry, in which Xd is taken as the center position for the pattern instead of a true center position Xw for the pattern to cause detection error ex as shown in FIG. 10 (b) as apparently shown from the coherent light intensity curve in FIG. 6 in the conventional alignment system. However., according to this invention, the intensity distribution 65 of the reflection light can be obtained with preferable symmetricity with no substantial effect from the distribution of the layer thickness of the photoresist 46 and at a high contrast, and the true center position Xw for the pattern can ideal be detected as shown in FIG. 10 (c).

As a result, it is possible to eliminate the reduction in the alignment accuracy due to the layer thickness and the uneven coating of the photoresist. resist.

This invention is also effective in a case where the alignment pattern is constituted as shown in FIG. 11, in which each of transparent layers, that is, $SiO_2$ 67 and $Si_3N_4$ 68 are formed on the step pattern of the Si substrate 65, because reflection light 78 from the interface 70 between underlying Si substrate 66 and $SiO_2$ 67 has the greatest intensity among the reflection lights 75, 76, 77 and 78 from each of the surface of photoresist 69, interfaces 72, 71 and 70 for each of the layers relative to incident light 74. Accordingly, since the intensity distribution of the interference thus obtained varies greatly at the step portion on the Si substrate 66, the similar effect described previously can be obtained with no substantial effect from the layer thickness of the photoresist 69.

Referring more specifically to this invention, FIG. 12 shows an alignment optical system in one embodiment of the system according to this invention. In this embodiment, the alignment optical system comprises an alignment irradiation system, an alignment pattern detecting optical system, a reference optical path and an alignment pattern detection signal processing system. In this embodiment, laser beam 81 from Ar laser (wavelength: 514.5 nm) 40a as a coherent light source is sent by way of beam splitter 42 and relay lens 83 and then split by beam splitter 84 into two beams 86 and 87. Among them, the beam 87 is introduced to a reference optical path comprising mirrors 85b–85f, a phase front correcting optical system 88 and a reflection mirror 51a and reflected at the reflection mirror 51a, in which the beam 87 is applied with adjustment for the beam diameter and phase adjustment for the phase front corresponding to the image-focusing characteristics of the reduction projection lens by the phase front correcting optical system 88. While on the other hand, the other beam 86 is successively reflected at mirror 85a and mirror lm on the reticle 1, then entered to the center for incident pupil 2p in reduction projection lens 2 and irradiated to the alignment pattern 48 on wafer 3. FIG. 13 shows the irradiation state in this case in an enlarged scale. The beam 86 comprises parallel beams and functions as alignment irradiation light.

In this case, by setting the difference in the optical path lengths between the optical path length from the beam splitter 84 to the reflection mirror 51a and the optical path length from the beam splitter 84 to the alignment pattern 48 on the wafer 3 by finely moving the reflection mirror 51a in the direction of the optical axis within an interfering distance of the Ar laser 40a, the reflection light from the reflection mirror 51a interferes with the reflection light from the surface of the alignment pattern 48 (interface 47 between the photoresist and the alignment pattern) to obtain the interference pattern in the beam splitter 84 just according to the similar principle of a Twyman-G green interference meter. The interference pattern is passed through he lens 83, beam splitter 42, mirror 85g and magnifying lens 90 successively and then picked-up in a 2-dimensional solid state image pick-up device 91. Then, the optoelectronically converted interference pattern from 2-dimensional solid state image pick-up device 91 is then subjected to noise elimination and AD conversion in preprocessing circuit 92 and further compressed electrically in the direction perpendicular to the alignment pattern detecting direction in vertical compression circuit 93. The center position for the alignment pattern 48 can be determined by applying a predetermined processing to a signal compressed into one-dimensional information by computer 94.

Referring to the processing in the computer 94, FIGS. 14 (a), (b) respectively show examples of interference patterns picked-up in the solid state image pick-up device 91. Detection area 95 for the alignment optical system to alignment pattern 48 is as shown in the figure. Referring at first to FIG. 14 (a), the figure shows the case where the reflection mirror 51a and the alignment pattern 48 are inclined relative to each other in the direction of arrows and fine interference fringes 96 are formed depending on the extent and the direction of the inclination. In this case, 1-dimensional signal 98 obtained by the compression is formed at low contrast as shown in FIG. 15 (a). It is necessary to set the reflection mirror 51a and the alignment pattern 46, that is, the wafer so as to be in completely parallel with each other. Assuming the size of one chip on the wafer as 20 mm×20 mm, since the inclination of the wafer in one chip is utmost about 1 μm, if the reflection mirror 51a is once finely adjusted, there is no more required to always monitor the state.

Then, referring to FIG. 14 (b), the figure shows an interference pattern in which the reflection mirror 51a and the wafer are in completely parallel with each other, so that image 97 with the intensity varying greatly at the step portion of the alignment pattern can be obtained. 1-dimensional signal 99 shown in FIG. 15 (b) is obtained as having correspondingly high contrast. In the computer 94, the center position Xw for the alignment pattern on the wafer (center position for the direction X) is determined by utilizing the symmetricity of the waveform from the 1-dimensional signal 99. The alignment amount Δ and the alignment direction can be determined based on the positional displacement between the thus obtained center position and the center position Xr for the alignment pattern (not illustrated) on the reticle obtained separately. The stage 4 is moved finely in the direction X based on the alignment amount Δ and the alignment direction. The alignment in the direction Y is conducted quite in the same manner as above. After the alignment has thus been completed, exposure light is irradiated from an exposure system (not illustrated), by which the circuit pattern on the reticle 1 is baked to the chip on the wafer 3. By repeating the operations for the foregoing alignment and baking on every chips, reduction projection exposure is carried out for the wafer 3.

Now, in the embodiment as has been described above, alignment pattern detection signals at a favorable symmetricity can be obtained free from the effects of the distribution of the layer thickness of the photoresist as described above, by which reduction in thealignment accuracy caused by the uneven coating of the photoresist can be removed. Further, the contrast of the alignment pattern detection signal has been varied greatly not only due to the uneven coating but also due to the coated layer thickness of the photoresist per se in the conventional alignment system, whereas the interference intensity can always be set to the inclined portion of the curve 63 shown in FIG. 3 by finely moving the reflection mirror 51a in the direction of the optical axis thereby keeping the signal contrast always high in the embodiment of this invention.

Figure 16:
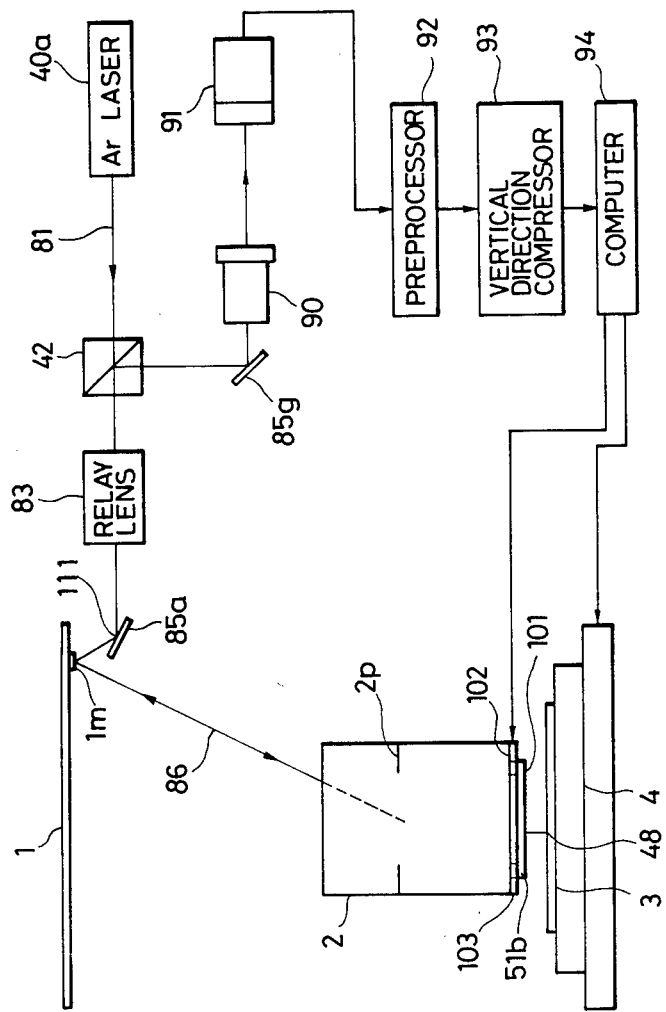
FIG. 16 is a view illustrating the alignment optical system in the second embodiment of the system according to this invention.
Figure 17A:
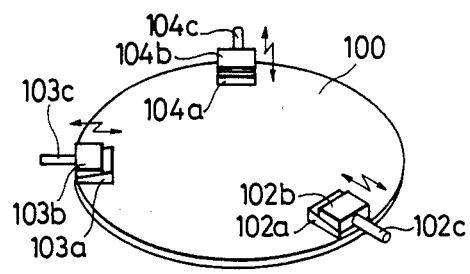
FIGS. 17 (a), (b) are views showing a finely moving mechanism for a half mirror and a portion thereof in the optical system.
Figure 17B:
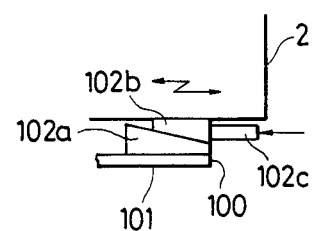
Figure 18:
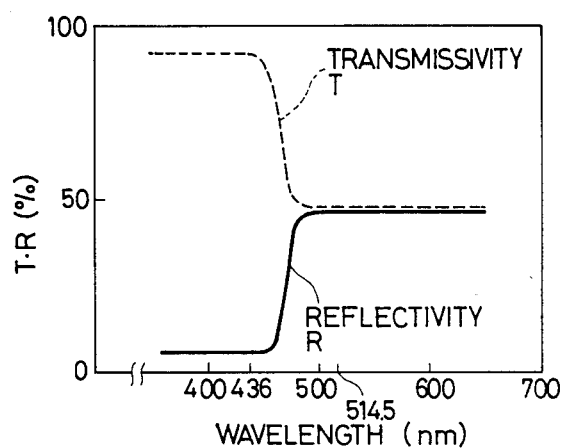
FIG. 18 is a view showing the spectral characteristics for the reflectivity and transmittance of thin films coated to the lower surface of a half mirror.
Figure 19A:
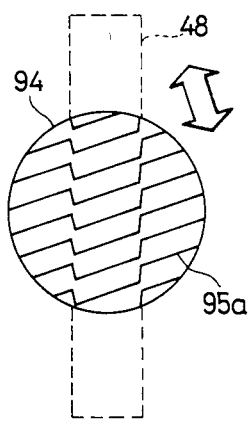
FIGS. 19 (a), (b) are plan views showing an interference fringe pattern in another embodiment.
Figure 19B:
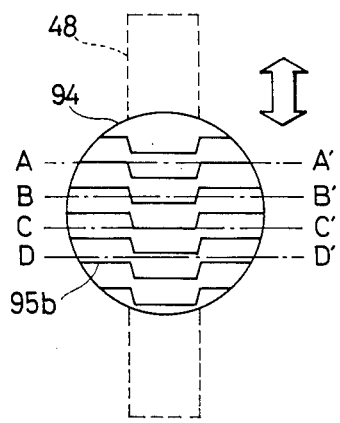
Figure 20:
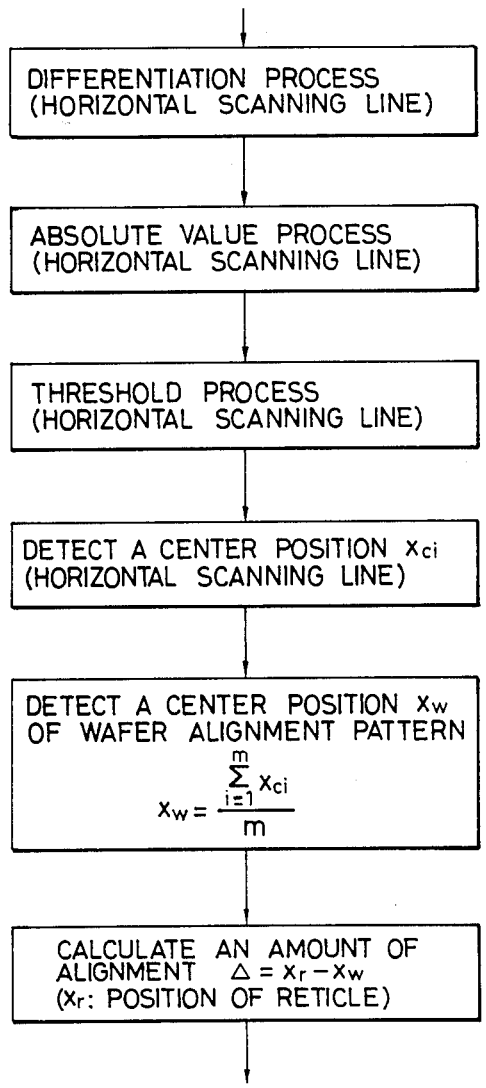
FIG. 20 is a flow chart for determining the center position for the alignment pattern based on the interference fringe pattern shown in FIG. 19 (b)

Referring then to another embodiment, FIG. 16 shows an optical system of such an embodiment. The alignment optical system is different from the alignment optical system shown in FIG. 12 in that the reference optical path is removed therefrom and half mirror 51b as a dichroic mirror is added to the end of the reduction projection lens 2 thus using the alignment irradiation optical path itself as the reference optical path. In the same manner as in the previous embodiment, the beam 81 from the Ar laser 40a is passed through the beam splitter 42 and the relay lens 83, reflected at the mirror 85a and at the surface of the mirror lm on the reticle 1 successively, then entered to the center of the incident pupil 2p in the reduction projection lens 2, further transmitted through the half mirror 51b and then entered as the irradiation light to the alignment pattern 48 on the wafer 3. In this case, reflection-preventive film (wavelength: 514 nm) is coated to the upper surface and a thin film having spectral characteristics for the reflectivity and the transmittance shown in FIG. 18 is coated to the lower surface 101 of the half mirror 51b. In the case of setting the optical path length from the lower surface 101 to the alignment pattern 48 within the interference distance of the Ar laser 40a by finely moving the half mirror 51b in the direction of the optical axis, the reflection light from the lower surface 101 of the half mirror 51b interfers with the reflection light from the alignment pattern 48 to obtain an interference pattern based on the similar principle to as that for the Fiezeau's interference meter. The interference pattern is delivered backwardly through the identical optical path by way of the reduction projection lens 2 and then picked-up by way of the beam splitter 42, mirror 85g and the magnifying lens 90 in the 2-dimension and procedures for the signal processing and the alignment thereafter are carried out quite in the same manner as in the previous embodiment.

The thin film coated to the lower surface 101 of the half mirror 51b has an extremely high transmittance relative to exposure wavelength 436 nm (g-ray of mercury lamp) as shown in FIG. 18 so as not to cause any substantially problem in the exposure. Further, reference 111 denotes the imaging position for the interference pattern. Referring briefly to the finely moving mechanism for the half mirror 51b, FIGS. 17 (a), (b) illustrate the finely moving mechanism for the half mirror 51b. The half mirror 51b is supported to the reduction projection lens 2 by way of leaf spring or the like (not illustrated) and the operation of the finely moving mechanism is attained by independently moving wedge-like movable spacers 102b, 103b and 104b relative to three wedge-like bases 102a, 103a and 104a secured to the upper surface of the half mirror 51b, for example, by three piezoelectric elements 102c, 103c and 104c respectively. While one end for each of the piezoelectric elements 102c, 103c and 104c is attached to each of the wedge-like movable spacers 102b, 103b and 104b, the other end is secured to the reduction projection lens 2. Accordingly, when a voltage signal is applied to the piezoelectric elements 102c, 103c and 104c, they are extended or contracted depending on the voltage signal thereby enabling to move the half mirror 51b finely in the vertical direction.

Accordingly, in this embodiment, it is possible to obtain not only the merits quite identical with the case of the previous embodiment but also the merits that the effect of external disturbances in the reference optical path or the image pick-up characteristics of the reduction projection lens per se on the interference pattern can be removed and the structure of the alignment optical system can be simplified by using the alignment optical path itself as the reference optical path.

A further embodiment of this invention will be explained referring to FIGS. 19 through 23. The interference light forms fringe patterns 95a, 95b corresponding to the relative inclination of the phase front of the reflection light from the reflection mirror 51 or half mirror 51b and the phase front from the surface of the alignment pattern 48 in the direction of the optical axis. That is, the reflection mirror 51a or the half mirror 51b is slightly inclined and the distance between the fringe patterns is decreased as the relative inclination between both of the phase fronts is increased. On the other hand, if both of the phase fronts are completely in parallel with each other as in the previous embodiment (in the case where the surface of the wafer is in completely parallel with the surface of the reflection mirror 51 or the half mirror 51b), the fringe patterns are eliminated and the brightness/darkness of the interference intensity due to the difference is the optical path between the inside and the outside of the pattern appears as shown in FIG. 14 (b) and FIG. 15 (b). The arrows show the inclined direction of both of the phase fronts, that is, the inclination direction of the reflection mirror 51a or the half mirror 51b and 94 represents the detection region of the alignment optical system. In this case, great signal changes appear in the fringe patterns 95a and 95b due to the change of the phase by the depth of the step in the step portion of the alignment pattern 48. One of the prominent features of this invention resides in that the position for the signal change in the fringe pattern corresponding to the step portion of the alignment pattern 48 is extracted and the center position for the alignment pattern 48 is determined based on the extracted position. The interference light obtained by the beam splitter 84, that is, the fringe patterns 95a and 95b shown in FIGS. 19 (a), (b) are sent by way of the relay lens 83, beam splitter 82, mirror 85g and magnifying lens 90 and picked-up by the 2-dimensional solid state image pick-up device 91. Then, the optoelectronically converted fringe patterns 95a and 95b are subjected to noise elimination and AD conversion in the pre-processing circuit 92 and then sent to the computer 93. In this embodiment, the reflection mirror 89 is previously adjusted finely such that the direction of the fringe pattern agrees with the direction of the horizontal scanning line in the 2-dimensional solid state image pick-up device 91, that is, with the direction shown in FIG. 19 with an aim of simplifying the signal processing and shortening the alignment time in the computer. Assuming the size of a chip on the wafer as 20 mm × 20 mm, since the parallism of the wafer in one chip is of about 1 $\mu$m, after the reflection mirror 51a has once been adjusted finely, it is no more necessary to always monitor the state. In the computer, the signal processing is carried out and the center position for the alignment pattern 48 is determined in accordance with the flow chart shown in FIG. 20. At first, FIGS. 21 (a)–(d) show horizontal scanning signals 96a–96d corresponding to the portions A—A', B—B', C—C' and D—D' in FIG. 19 (b). While a great signal change appears due to the phase change at the pattern step portion in FIGS. 19 (a)-(c), FIG. 21 (d), that is, D—D' just corresponds to the bright portion between the fringes in which no signal changes are present. Differentiation processing is applied to all of the horizontal scanning signals from the 2-dimensional solids state image pick-up devices in accordance with the flow chart shown in FIG. 20. As a result, signals 97a–97d shown in FIGS. 22 (a)-(d) are obtained. When applying absolute value processing to these signals, signals 98a–98d shown in FIGS. 23 (a)-(d) are obtained. Then, an appropriate threshold value is set to these signals and picture element numbers a1–a4, b1–b4, c1–c4, etc. corresponding to the threshold value are determined for all of the horizontal scanning signals and they are stored in a memory. In this case, no subsequent processings are carried for those horizontal scanning signals with no corresponding to picture element numbers such as the signals shown in FIG. 23 (d) in order to shorten the calculation time. The following processing is carried out for the stored picture element numbers and the center positions $a_c$, $b_c$, $c_c$ and the like for the alignment pattern are determined on every horizontal scanning lines.

$$a_c = \frac{\sum_{j=1}^{4} aj}{4} \quad (2)$$

$$b_c = \frac{\sum_{j=1}^{8} bj}{8} \quad (3)$$

$$c_c = \frac{\sum_{j=1}^{4} cj}{4} \quad (4)$$

Expressing the thus determined center position for each of the horizontal scanning lines as c (i=1−m), the center position Xw for the wafer alignment pattern is finally given by the equation (5):

$$Xw = \frac{\sum_{i=1}^{m} Xci}{m} \quad (5)$$

for the number m, there are present picture element numbers corresponding to an appropriate threshold level set to the horizontal scanning signals applied with the absolute value processing as shown in FIGS. 23 (a)–(c). In other words, this represents the total number of horizontal scanning signals in which the signal changes corresponding to the pattern stepped portion are present. Then, the alignment amount Δ is determined based on the following equation (6) from the center position Xr for the alignment pattern (not illustrated) on the mask (reticle) obtained separately:

$$\Delta = Xr - Xw \quad (6)$$

and the stage 4 is moved finely in the direction X. The procedures for the alignment in the direction Y are applied quite in the same manner. After the alignment has thus been completed, exposure light is irradiated from the exposure system (not illustrated) and the circuit pattern of the reticle 1 is baked to the chip on the wafer. The foregoing operations are repeated for each of the chips.

As has been described above according to this embodiment, high contrast alignment pattern detection signals with favorable symmetricity can be obtained free from the effect of the distribution of the layer thickness of the photoresist and the decrease in the alignment accuracy due to the uneven coating of the photoresist can be eliminated. Further, although the contrast in the alignment pattern detection signal has been greatly varied not only due to the uneven coating but also the thickness of the coated layer itself of the photoresist in the conventional alignment system, the contrast of the frnge patterns shown in FIGS. 19 (a), (b) can also be kept high by finely moving the reflection mirror 89 in the direction of the optical axis thereby always setting the interference intensity to the inclined portion of the curve 63 shown in FIG. 9 according to this embodiment.

Further, according to this embodiment, the rotational error of the chip can be determined based on the center position Xci for the pattern obtained from each of the horizontal scanning signals. That is, the correction for the rotation of the chip which is considered indispensable for the exposure of integrated circuit pattern of increased density in the future can easily be realized.

Although the differentiated absolute values for the signals are used in this embodiment for extracting the signal varying positions in the pattern step portion in each of the horizontal scanning signals in this embodiment, it is also possible to directly set a threshold value to horizontal scanning signals 96a–96d (FIG. 21), detect the picture element numbers corresponding to the threshold level and the determine the center position for the alignment pattern from the value thereof.

As a further embodiment, it is also possible to determine the center position Xci for the pattern relative to each of the horizontal scanning signals by utilizing the symmetricity of signal waveform. In this case, the final center position Xw for the wafer alignment is determined from the equation (5).

The alignment pattern of the mask 1 may be detected using the conventional system. That is, it is possible to detect the content as described in U.S. Pat. No. 4,362,389 or U.S. application Ser. No. 68,429.

Further, if the mask alignment pattern detection optical system is matched with the wafer alignment pattern optical system, both of the alignment patterns can be detected in the 2-dimensional solid state image pick-up device 91.

Then, when the relative positional displacement of the mask wafer has been detected, a mask table or wafer table is finely moved (X, Y, θ (rotation)) to attain the alignment so as to eliminate the relative positional displacement. If the alignment is conducted for all of the exposure region with respect to X and Y excepting for θ, highly accurate alignment is possible and integrated circuit of fine structure can be exposed.

As has been described above by the alignment system according to this invention, lowering in the alignment accuracy due to the coated film thickness and the uneven coating of the photoresist that has been pointed out so far but not yet been solved at present and have brought about severe problems along with the increased density of the semiconductor circuits, can be eliminated thereby enabling stable and highly accurate alignment to obtain high productivity and reliability. Furthermore, according to the system of this invention, throughput as comparable with that in the conventional chip alignment can be obtained and further improved accuracy coupled with higher overall performance as compared with the conventional system can also be obtained.

What is claimed is:

1. A reduction projection type aligner in a reduction projection exposing device for exposing a circuit pattern on a mask through a reduction projection lens onto a wafer by the step and repeat of the wafer, which comprises:

light source means for irradiating coherent irradiation light, reflection mirror means for reflecting the coherent irradiation light irradiated from said light source means, a detection optical system for detecting an interference pattern by optically causing interference between reflection light reflected at said reflection mirror means and an alignment pattern irradiating light obtained by entering said coherent irradiation light irradiated from said light source means through the reduction projection lens to an alignment pattern portion of the wafer, which is then reflected at said alignment pattern portion and then passed through said reduction projection lens, and means for aligning the mask and the wafer relatively by detecting the position of the wafer by a video image of the interference pattern detected by said detection optical system.

2. A reduction projection type aligner as defined in claim 1, wherein alignment pattern of the mask is also detected by the detection optical system.

3. A reduction projection type aligner as defined in claim 1, wherein a branching optical system for branching the coherent irradiation light irradiated from the light source means into the reflection mirror means and into the reduction projection lens is provided for disposing said reflection mirror means out of an optical path of the alignment pattern irradiation light onto the wafer.

4. A reduction projection type aligner as defined in claim 1, wherein the reflection mirror means is disposed within an optical path of the alignment pattern irradiation light onto the wafer and constituted with a half mirror.

5. A reduction projection type aligner as defined in claim 1, wherein the light source means irradiates spatially and temporally coherent light.

6. A reduction projection type aligner as defined in claim 3, wherein a phase front correcting optical system is provided in an optical path in which the reflection mirror means is disposed.

7. A reduction projection type aligner as defined in claim 1, wherein means for finely moving the reflection mirror means in a direction of an optical axis of light incident thereto is disposed so that the contrast of the video image of the interference pattern can be improved.

8. A reduction projection type aligner as defined in claim 1, wherein the reflection mirror means is slightly inclined to a direction orthogonal to an optical axis of light incident to the reflection mirror means so that an interference fringe pattern is generated.

* * * * *